(12) United States Patent
Wuu et al.

(10) Patent No.: US 11,233,510 B2
(45) Date of Patent: Jan. 25, 2022

(54) IN MEMORY LOGIC FUNCTIONS USING MEMORY ARRAYS

(71) Applicant: Advanced Micro Devices, Inc., Santa Clara, CA (US)

(72) Inventors: John J. Wuu, Fort Collins, CO (US); Edward Chang, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/965,186

(22) Filed: Apr. 27, 2018

(65) Prior Publication Data
US 2019/0334524 A1 Oct. 31, 2019

(51) Int. Cl.
| | |
|---|---|
| G11C 7/06 | (2006.01) |
| H03K 19/00 | (2006.01) |
| G11C 11/412 | (2006.01) |
| G11C 11/419 | (2006.01) |
| G06F 3/06 | (2006.01) |
| G11C 11/418 | (2006.01) |

(52) U.S. Cl.
CPC ....... *H03K 19/0013* (2013.01); *G06F 3/0604* (2013.01); *G06F 3/0659* (2013.01); *G06F 3/0673* (2013.01); *G11C 11/412* (2013.01); *G11C 11/419* (2013.01); *G11C 11/418* (2013.01)

(58) Field of Classification Search
CPC .................................................. G11C 7/1006
USPC ..................................................... 365/189.15
See application file for complete search history.

(56) References Cited

U.S. PATENT DOCUMENTS

| | | | | |
|---|---|---|---|---|
| 2003/0222879 | A1* | 12/2003 | Lin ........................... | G06F 7/57 |
| | | | | 345/530 |
| 2009/0141537 | A1* | 6/2009 | Arsovski .............. | G11C 7/1006 |
| | | | | 365/154 |
| 2017/0345481 | A1* | 11/2017 | Hush .................... | G11C 11/4091 |
| 2017/0345505 | A1* | 11/2017 | Noel ........................ | G11C 8/16 |

(Continued)

OTHER PUBLICATIONS

Borowik et al., "On Memory Capacity to Implement Logic Functions", International Conference on Computer Aided Systems Theory, Jan. 2012, pp. 343-350, http://citeseerx.ist.psu.edu/viewdoc/download?doi=10.1.1.1031.459&rep=rep1&type=pdf. [Retrieved Feb. 8, 2018].

(Continued)

*Primary Examiner* — Min Huang
(74) *Attorney, Agent, or Firm* — Kowert Hood Munyon Rankin and Goetzel PC; Rory D. Rankin

(57) ABSTRACT

Systems, apparatuses, and methods for efficiently performing operations system are disclosed. A computing system uses a memory for storing data, and one or more processing units. The memory includes multiple rows for storing the data with each intersection of a row and a column being a memory bit cell. The memory processes operations. For particular operations, the two or more operands are accessed simultaneously for generating a result without being read out and stored. Two indications are generated specifying at least a first row and a second row targeted by the operation. The memory generates a result by performing the operation for each of the one or more cells in the first row a stored value with a respective stored value in the one or more cells in the second row.

20 Claims, 7 Drawing Sheets

(56) References Cited

U.S. PATENT DOCUMENTS

2018/0248800 A1* 8/2018 Inoue .................... G11C 15/04

OTHER PUBLICATIONS

Gao et al., "Implementation of Complete Boolean Logic Functions in Single Complementary Resistive Switch", Scientific Reports, Oct. 21, 2015, 10 pages, https://www.nature.com/articles/srep15467.pdf. [Retrieved Feb. 8, 2018].

Levy et al., "Logic operations in memory using a memristive Akers array", Microelectronics Journal, Nov. 2014, pp. 1429-1437, vol. 45, Issue 11.

"Memory and Programmable Logic", 17 pages, https://www.slideserve.com/vidar/memory-and-programmable-logic. [Retrieved Feb. 8, 2018].

Yaakobi et al., "In-Memory Computing of Akers Logic Array", 2013 IEEE International Symposium on Information Theory Proceedings (ISIT), Jul. 2013, pp. 2369-2373, https://pdfs.semanticscholar.org/333b/10610fc509161dac5bbe8dfff0ea1a89b569.pdf. [Retrieved Feb. 8, 2018].

* cited by examiner

IN MEMORY LOGIC FUNCTIONS USING MEMORY ARRAYS

BACKGROUND

Description of the Related Art

Semiconductor chips often include at least one processing unit coupled to a memory. The processing unit processes instructions by retrieving instructions and data from the memory, decoding and executing the instructions, and storing the results of the execution. Examples of processing units include general-purpose central processing units (CPUs), processors with parallel data microarchitectures such as graphics processing units (GPUs), an accelerated processing unit (APU), multimedia engines, and so forth.

For semiconductor chips with multiple processing units, the demands placed upon a shared memory are increased. In some implementations, the processing units and the memory are on different integrated circuits (or "chips" or "dies") within a same package such as in a system-in-a-package (SiP). In other cases, processing units, memory, and other components are integrated in a single integrated circuit (a single chip) such as in a system-on-a-chip (SoC). Static random access memory (SRAM) is commonly used for memory. These memories include an array of bit cells arranged as rows and columns, as well as logic used for accessing values stored in the array. In various implementations, one or more of the processing units process software applications that include operations such as "logic" operations. In some implementations, these logic operations are Boolean logic operations.

Machine learning is one example of a field where a relatively large number of computations are performed that include logic operations. Typically, when a Boolean operation is performed on a first operand and a second operand, each of the two operands are separately read from memory and stored in respective registers. Consequently, the memory array is accessed twice—once to retrieve the first operand and once to retrieve the second operand. Subsequently, the Boolean operation is performed on the contents stored in the registers and the results of the operation may then be stored in the memory. Due to the need to perform multiple accesses to the memory to retrieve the data values being operated upon, the latency and power consumption involved in such computations may be greater than desired.

In view of the above, efficient methods and systems for efficiently performing operations are desired.

BRIEF DESCRIPTION OF THE DRAWINGS

The advantages of the methods and mechanisms described herein may be better understood by referring to the following description in conjunction with the accompanying drawings, in which.

Figure 1:
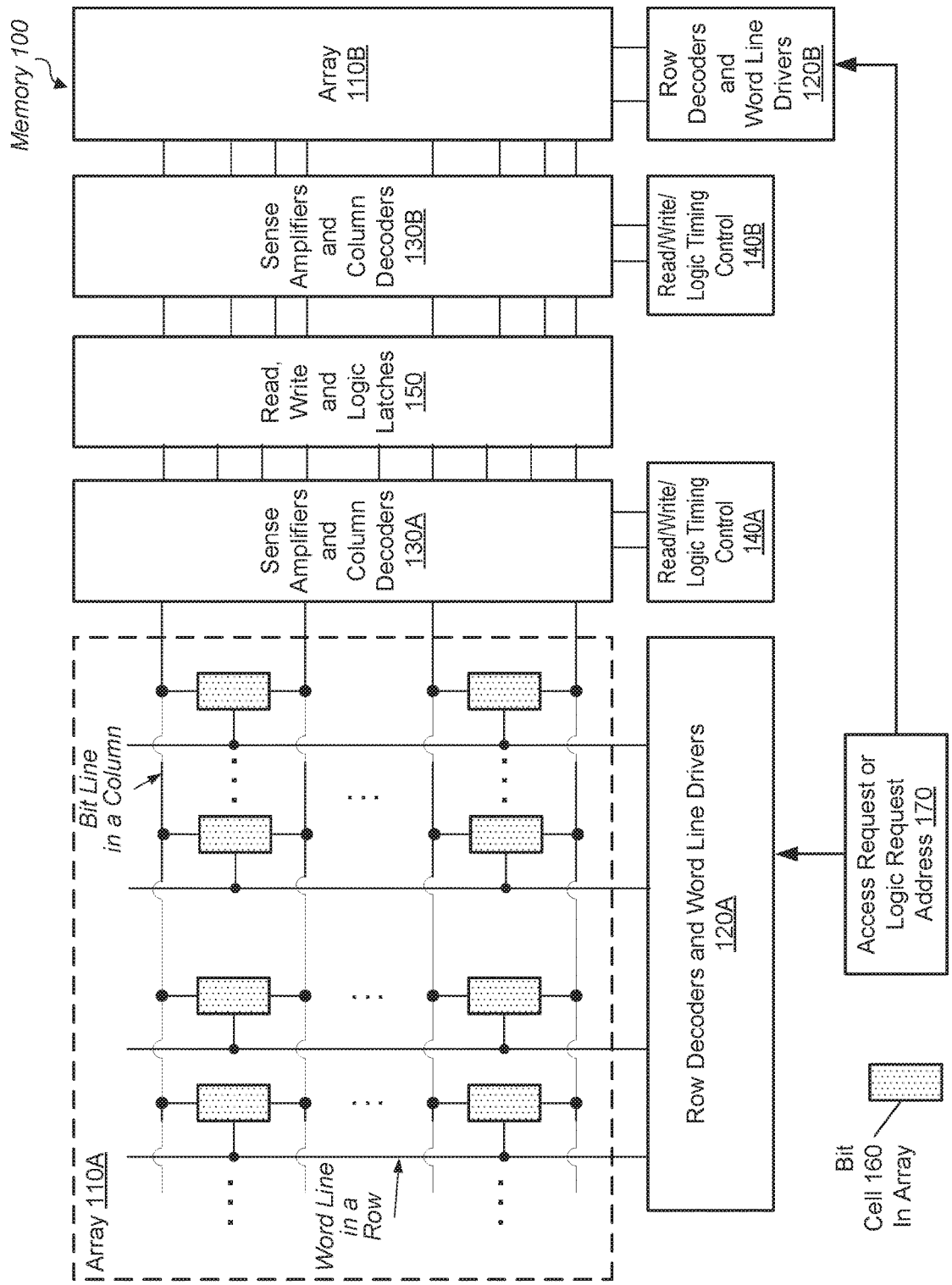
FIG. 1 is a block diagram of one implementation of a memory.

While the invention is susceptible to various modifications and alternative forms, specific implementations are shown by way of example in the drawings and are described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable media for efficiently performing operations are disclosed. In various implementations, a computing system uses a memory for storing data, and one or more processing units to perform computations. The memory is arranged as an array of rows and columns with each intersection of a row and a column being a memory bit cell. In some implementations, each one of the memory bit cells is a copied variation of a six-transistor random access memory (RAM) cell selected based on design needs. In other implementations, another one of various types of RAM cells is used. In some implementations, the memory is a cache in a cache memory subsystem. In other implementations, the memory is a register file. In various implementations, a memory controller includes access logic that is separate from the memory array. In some implementations, the memory controller also includes other logic for prioritizing requests and responses, and performing other functions.

Examples of processing units include a general-purpose central processing unit (CPU), a graphics processing unit (GPU), an accelerated processing unit (APU), a multimedia engine, and so forth. These processing units generate access requests for data stored in memory while executing program instructions. In addition, the processing units process operations while executing the instructions. In some implementations, the operations are logic operations (e.g., Boolean logic operations). In other implementations, other operations may be performed. For example, in some implementations, the operation(s) may be arithmetic (e.g., addition, subtraction, multiplication, division), comparison, and/or other operations.

In various implementations, a given processing unit determines an instruction is configured to perform a given operation through decoding or pre-decoding logic. In various implementations, when the given processing unit determines an instruction corresponds to an operation, the processing unit determines whether the operation is to be sent to memory for processing or to an execution unit of the processing unit (e.g., an arithmetic logic unit (ALU)). In some implementations, particular Boolean logic operations are more efficiently processed in memory. In an implementation, the particular Boolean logic operations are a Boolean NAND operation, a Boolean NOR operation, a Boolean XOR operation, an inverted value of the outputs of these operations, and a combination of these operations.

For operations that qualify to be sent to memory for processing, the given processing unit sends a corresponding request to the memory. The memory controller supports mapping between received request addresses and rows corresponding to storage locations in the memory. When the memory controller receives an indication of the request for the operation, in some implementations the memory controller generates two indications specifying a first row and a second row different from the first row targeted by the operation. In various implementations, the two indications are two word lines corresponding to the first row and the second row.

In an implementation, the memory simultaneously accesses one or more cells in the first row and one or more cells in the second row. Therefore, two separate accesses are not used to access data stored in the two rows. In some implementations, the memory generates a first result by performing an operation on a stored value in each of the one or more cells in the first row with a respective stored value in the one or more cells in the second row. The memory then conveys a result of the operation. In an implementation, the memory generates and conveys the result in a single pipeline stage. These and other implementations are possible and are contemplated.

Referring to FIG. 1, a generalized block diagram of one implementation of a memory 100 is shown. In various implementations, the memory 100 is used for a register file, a cache, or other memory for a processing unit. In some implementations, the memory 100 is a left bank or a right bank of a banked memory. As shown, the memory 100 includes arrays 110A-110B, row decoders 120A-120B, sense amplifiers and column decoders 130A-130B between the arrays 110A-110B, read and write timing control logic 140A-140B, and read latches and write latches in block 150.

In various implementations, each of the blocks 110A-110B, 120A-120B, 130A-130B, 140A-140B and 150 in the memory 100 is communicatively coupled to another one of the blocks. For example, direct connections are used wherein routing occurs through another block. Alternatively, staging of signals is done in an intermediate block. In various implementations, each of the arrays 110A-110B includes multiple memory bit cells 160 arranged in a tiled format. In some implementations, each one of the memory bit cells 160 is a copied variation of a six-transistor RAM cell selected based on design needs. In other implementations, different types of RAM cells are used. For example, an eight-transistor RAM cell, a ten-transistor RAM cell, or otherwise is used for one or more of the memory bit cells 160. In such implementations, the number of bit lines in a column increases. Rather than have one bit line for the value stored in a memory bit cell and one bit line for the complementary (inverted) value stored in the memory bit cell, two or more bit lines are used for each of the value and the complementary value. In some implementations, one or more of the bit lines are used for providing a result of an operation, rather than a read value corresponding to the value or its complement.

The row decoders and word line drivers in blocks 120A-120B receive address information corresponding to an access request. In some implementations, the column decoders in blocks 130A-130B also receive address information corresponding to an access request. For example, one or more of blocks 120A-120B and blocks 130A-130B receives the information provided by the access request address 170. Each one of the blocks 120A-120B selects a particular row, or entry, of the multiple rows in an associated one of the arrays 110A-110B. In some implementations, the blocks 120A-120B use an index portion of the address 170 for selecting a given row, or entry, in an associated one of the arrays 120A-120B. Each row, or entry, stores one or more memory lines. In some implementations, each of the blocks 130A-130B selects particular columns, or bit fields, in an associated one of the arrays 110A-110B. In an implementation, the start of the address and the data size of the access request determines which columns are selected for access.

In the implementation shown, the rows, or entries, in the arrays 110A-110B are arranged in a vertical orientation. However, in other implementations, a horizontal orientation is used for storage of the memory lines. In the implementation shown, the columns in the arrays 110A-110B are arranged in a horizontal orientation. However, in other implementations, a vertical orientation is used. For write access requests, the write latches are located in block 150. The write data is driven into the arrays 110A-110B. The timing control logic 140a-140B sets up the write word line driver logic and updates the write latches with new data in block 150. The write data is written into a row of bit cells that is selected by an associated one of the blocks 120A-120B. In some implementations, precharge circuitry is included in block 150.

For read access requests, blocks 130A-130B used to precharge the read lines routed to the arrays 110A-110B. The timing logic in blocks 140A-140B is used for precharging and setting up the sense amplifiers in the blocks 130A-130B. The timing control logic 140A-140B sets up the read word line driver logic. A row selected by an associated one of the row decoders 120A-120B provides its data on the read lines, which are sensed by the sense amplifiers. The read latches capture the read data. If an entire row is not read, then the timing control logic 140A-140B sets up the column select logic. A row selected by an associated one of the row decoders 120A-120B provides its data on the read lines, but only the selected columns have the data propagated as output values captured by read latches. In various implementations, blocks 130A-130B include column multiplexing logic that receives decoded signals from the column decoders. The column multiplexing logic determines which columns in arrays 110A-110B have the data provided on bit lines be captured by latches, or other sequential elements, in block 150.

For operations, blocks 130A-130B are also used to precharge the bit lines routed to the arrays 110A-110B. The timing logic in blocks 140A-140B is used for precharging and setting up the sense amplifiers in the blocks 130A-130B. The timing control logic 140A-140B sets up the word line driver logic. A row selected by an associated one of the row decoders 120A-120B combines its data on particular bit lines, which are sensed by the sense amplifiers. The data is combined with data stored in one or more other rows selected by an associated one of the row decoders 120A-120B. Therefore, more than a single row is accessed simultaneously during an evaluation stage for the operation.

In various implementations, during a precharge stage, sense amplifiers precharge bit lines used for operations. During an evaluation stage, particular transistors in the selected memory bit cells 160 discharge the bit line based on a value or a complementary value stored in the memory bit cell. In one example, the memory 100 receives an indication of a Boolean NOR logic operation along with two register identifiers or two addresses corresponding to two operands. In other examples, more than two operands are used in the Boolean NOR logic operation. In the current example, two rows are selected by the row decoders 120A-120B.

In a similar manner, particular columns are selected by column decoders and column multiplexing logic in blocks 130A-130B. Particular transistors in a first memory bit cell in the selected first row pull down, or discharge, the bit line corresponding to the Boolean NOR logic operation based on a value stored in the first memory cell. Similarly, particular transistors in a second memory bit cell in the selected second row pull down, or discharge, the bit line corresponding to the Boolean NOR logic operation based on a value stored in the second memory cell. In some implementations, an inverter or other combinatorial logic cell receives the output of the column multiplexer connected to the bit line corresponding to the Boolean NOR logic operation. Therefore, a Boolean OR logic output is generated. Alternatively, other logic outputs are generated based on the Boolean NOR logic output. The logic latches, or other sequential elements, in block 150 capture the Boolean logic output.

Figure 2:
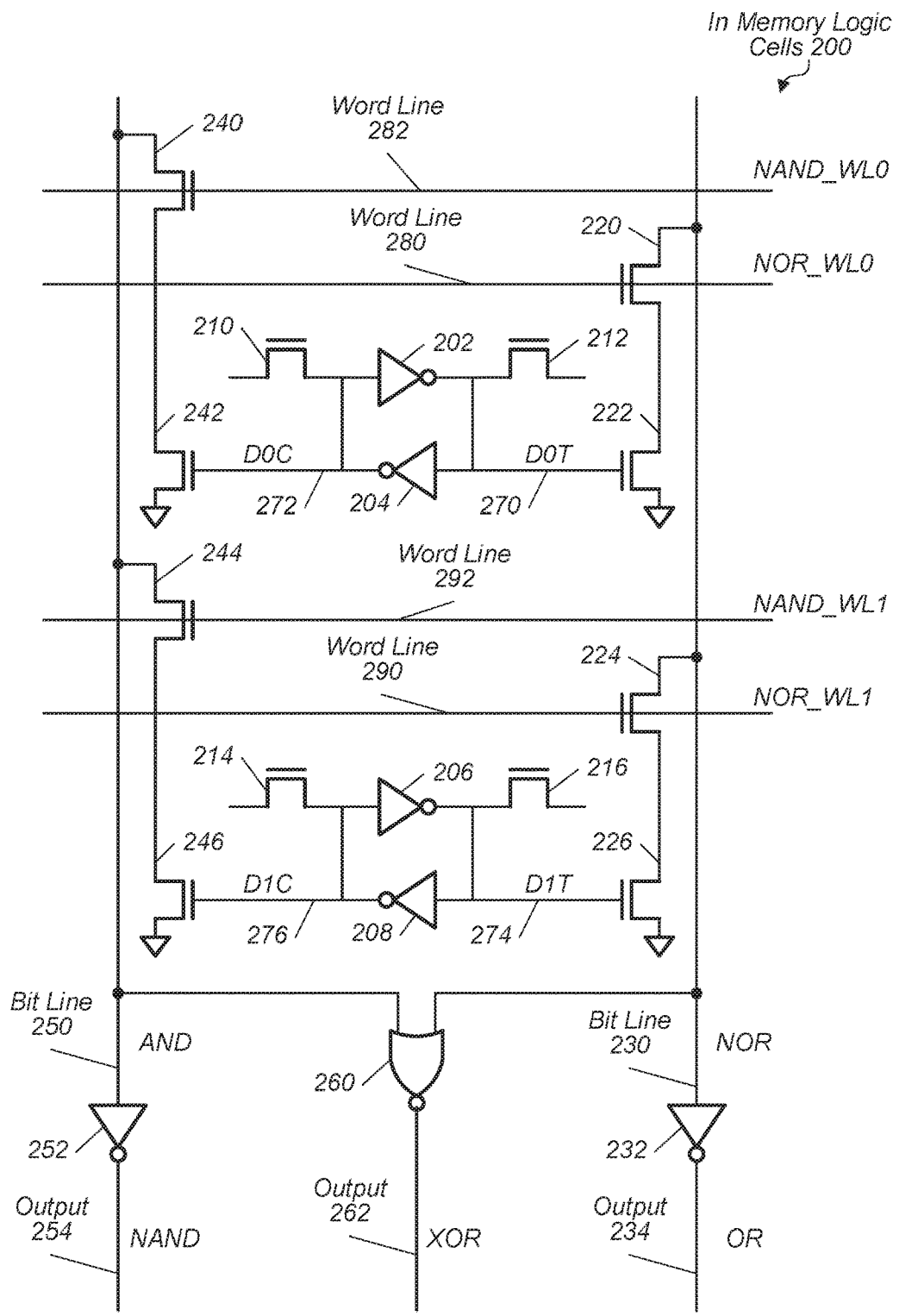
FIG. 2 is a block diagram of one implementation of in memory logic cells.

Turning now to FIG. 2, a generalized block diagram of one implementation of an in memory logic cells 200 used in a memory array is shown. In the implementation shown, data storage in two memory bit cells uses a variation of the six-transistor (6T) random access memory (RAM) cell. In other implementations, another one of various types of RAM cells is used. In an implementation, the memory bit cells in cells 200 are copied many times and arranged in an array of rows and columns for a memory. As described earlier, the memory includes external logic (not shown) such as row decoders and column decoders for selecting particular rows and columns to access for read operations, write operations, and operations. The external logic also includes sense amplifiers and latches for storing read and write access data and operation results.

In the illustrated implementation, cross coupled inverters 202-204 provide storage as a latching element for two values. For a first memory bit cell, node 270 is a first value being stored, which is a value indicated as "D0T." A second value being stored on node 272 is a complementary (inverted) value indicated as "D0C" for the first memory bit cell. In a similar manner, cross coupled inverters 206-208 provide storage as a latching element of two values. For a second memory bit cell, node 274 is a first value being stored, which is a value indicated as "D1T." A second value being stored on node 276 is a complementary (inverted) value indicated as "D1C" for the second memory bit cell.

In some implementations, for the first memory bit cell, pass gate n-type metal oxide semiconductor (NMOS) field effect transistors (FETs) 210 and 212 are used for write operations. For example, NMOS transistors 210 and 212 are used to provide access between write data bit lines and the data storage nodes 270 and 272. When the pass gates (NMOS transistors 210 and 212) are enabled by a write word line input on the gate terminals of the pass gates 210 and 212, the latching element has access to write data bit lines connected to the drain/source terminals of the transistors 210 and 212, which are the terminals not connected to the storage nodes 270 and 272. The write word line input and the write data bit lines are not shown for ease of illustration. The pass gates 214 and 216 operate in a similar manner for writing data into the second memory bit cell.

When a request for a Boolean NOR operation is sent to memory, and the first memory bit cell is selected as one of the operands, the word line input 280, which is also indicated as "NOR_WL0", is asserted. The NMOS transistor 220 receives the word line input 280 on its gate terminal. The drain terminal of the NMOS transistor 220 is connected to the bit line 230. The bit line 230, which is also indicated as "NOR", provides the Boolean NOR output for the column which includes at least the two memory bit cells shown. In various implementations, the bit line 230 is precharged during a precharge phase or stage. In an implementation, bit line 230 is discharged during an evaluation phase or stage. The source terminal of the NMOS transistor 220 is connected to the drain terminal of the NMOS transistor 222. The gate terminal of the NMOS transistor 222 is connected to the storage node 270 and the source terminal of the NMOS transistor 222 is connected to a ground reference.

When the word line input 280 is asserted, the NMOS transistor 220 is enabled. For example, when the word line input 280 has a Boolean logic high value, the NMOS transistor 220 is enabled. As used herein, a Boolean logic high level is also referred to as a logic high level. Similarly, a Boolean logic low level is also referred to as a logic low level. When the storage node 270 stores a logic low value, the NMOS transistor 222 is disabled, or turned off. Accordingly, the bit line 230 is not discharged by the first memory cell. However, when the storage node 270 stores a logic high value, the NMOS transistor 222 is enabled, and the serially connected stack of NMOS transistors 220 and 222 discharge the bit line 230 from a precharged logic high value to a logic low value. In other words, the stack of NMOS transistors 220 and 222 evaluate the output bit line 230 to be a logic low value.

One or more other memory bit cells are also selected to provide operands for the Boolean NOR operation, since the Boolean NOR operation has two or more operands. For example, if the below memory bit cell is also selected, the word line input 290, which is indicated as "NOR_WL1", is asserted. The serially connected transistors 224 and 226 operate similarly as the serially connected transistors 220 and 222.

The logic value on bit line 230 is received by the inverter 232 to provide a result on the output node 234. In other implementations, another Boolean logic gate other than the inverter 232 is used to receive the logic value on bit line 230. In some implementations, a column multiplexer (not shown) receives the value on the output node 234. Sequential elements and/or other combinatorial logic gates receive the output of the column multiplexer. Therefore, an operation, such as a Boolean NOR operation, is processed by the memory using a simultaneous access of two or more rows in the memory.

When a request for a Boolean NAND (or AND) operation is sent to memory, and the first memory bit cell is selected as one of the operands, the word line input 282, which is also indicated as "NAND_WL0", is asserted. The NMOS transistor 240 receives the word line input 282 on its gate terminal. The drain terminal of the NMOS transistor 240 is connected to the bit line 250. The bit line 250, which is also indicated as "AND", provides the Boolean AND output for the column which includes at least the two memory bit cells shown. In various implementations, the bit line 250 is precharged during a precharge phase or stage. In an implementation, bit line 250 is discharged during an evaluation phase or stage. The source terminal of the NMOS transistor 240 is connected to the drain terminal of the NMOS transistor 242. The gate terminal of the NMOS transistor 242 is connected to the storage node 272 and the source terminal of the NMOS transistor 242 is connected to a ground reference.

When the word line input 282 is asserted, or has a logic high value, the NMOS transistor 240 is enabled. When the storage node 272 stores a logic low value, the NMOS transistor 242 is disabled, or turned off. Accordingly, the bit line 250 is not discharged by the first memory cell. However, when the storage node 272 stores a logic high value, the NMOS transistor 242 is enabled, and the serially connected stack of NMOS transistors 240 and 242 discharge the bit line 250 from a precharged logic high value to a logic low value. In other words, the stack of NMOS transistors 240 and 242 evaluate the output bit line 250 to be a logic low value.

One or more other memory bit cells are also selected to provide operands for the Boolean NAND operation, since the Boolean NAND operation has two or more operands. For example, if the below memory bit cell is also selected, the word line input 292, which is indicated as "NAND_WL1", is asserted. The serially connected transistors 244 and 246 operate similarly as the serially connected transistors 240 and 242.

The logic value on bit line 250 is received by the inverter 252 to provide a result on the output node 254. In other implementations, another Boolean logic gate other than the inverter 252 is used to receive the logic value on bit line 250. In some implementations, a column multiplexer (not shown) receives the value on the output node 254. Sequential elements and/or other combinatorial logic gates receive the output of the column multiplexer. Therefore, an operation, such as a Boolean NAND operation, is processed by the memory using a simultaneous access of two or more rows in the memory.

In some implementations, a Boolean NOR gate 260 receives the values on the bit lines 230 and 250. The Boolean NOR gate 260 provides an exclusive-or (XOR) result on the output node 262. In one example, if the value on node 274 is "A," and a selected value in the same column but in a separate row such as node 270 is "B," then the bit line 230 provides the Boolean NOR of A and B (i.e., !(A+B)). Here, the exclamation point "!" indicates the Boolean complementary value and the "+" indicates a Boolean OR operation. The complementary value !A on node 276 and the complementary value !B on node 272 (in the same column but in a different row), are used to discharge the bit line 250 in an implementation. In this example, the bit line 250 provides the Boolean AND output AB. The Boolean NOR gate 260 receives the value !(A+B) on bit line 230 and the value AB on bit line 250. Therefore, the output of gate 260 is !(!(A+B)+AB), which reduces to A(!B)+!(A)B. This output is the exclusive-or (XOR) result for the inputs A and B.

In a manner similar to that of output nodes 234 and 254, the value on the output node 262 is received by one or more of a column multiplexer, other combinatorial logic and sequential elements. Although two bit lines, such as bit lines 230 and 250, are shown for providing Boolean results, it is noted that in some implementations only a single bit line is used. Therefore, in some implementations, only bit line 230 is used for providing a Boolean NOR output. In this implementation, transistors 240, 242 244 and 246, and bit line 250 are not included. Accordingly, this implementation uses an eight-transistor (8T) random access memory (RAM) cell. In another implementation, only bit line 250 is used for providing a Boolean AND output. In this implementation, transistors 220, 222 224 and 226, and bit line 230 are not included. Accordingly, this implementation also uses an eight-transistor (8T) random access memory (RAM) cell.

Figure 3:
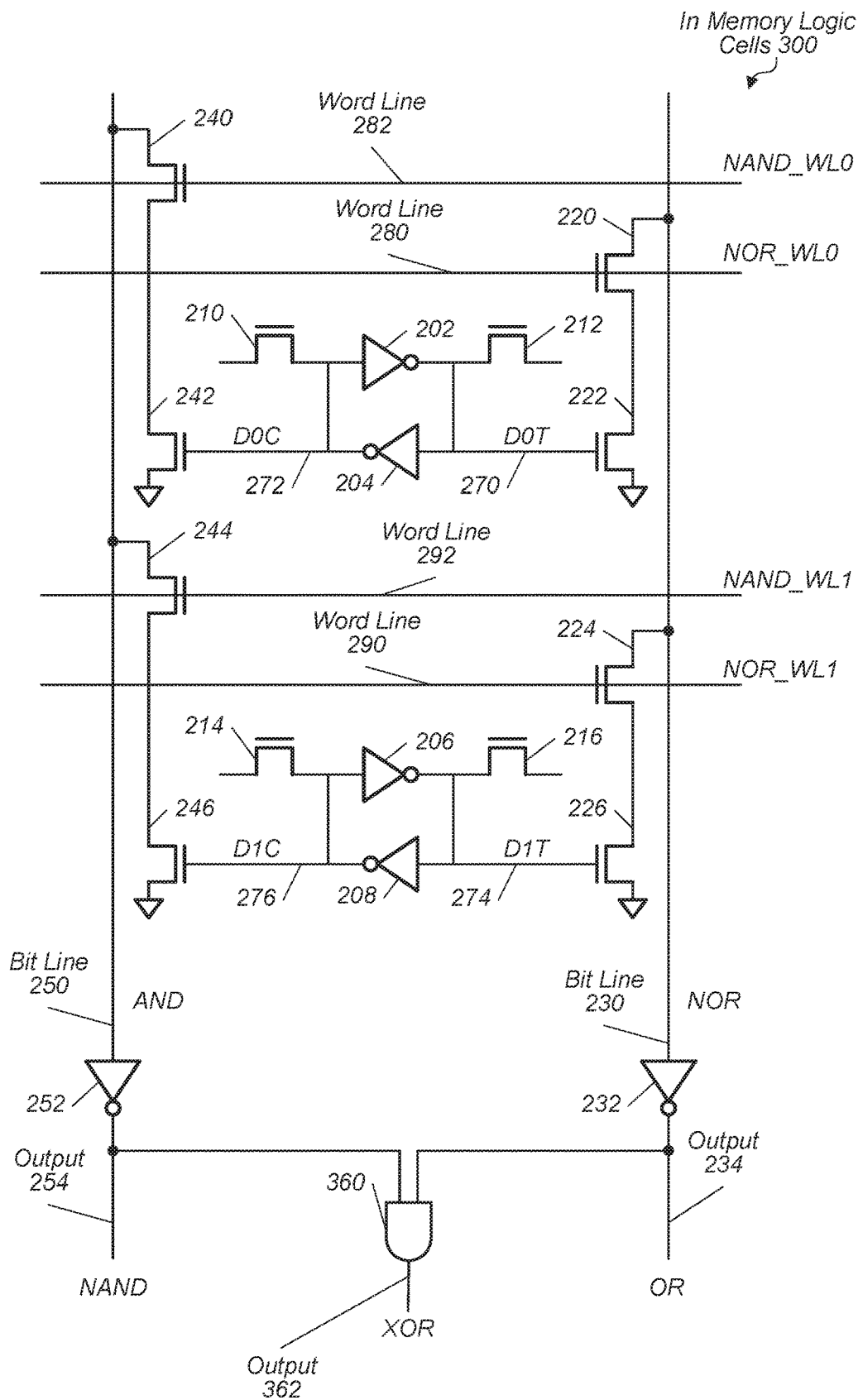
FIG. 3 is a block diagram of another implementation of in memory logic cells.

Turning now to FIG. 3, a generalized block diagram of another implementation of an in memory logic cells 300 used in a memory array is shown. Circuitry and logic previously described are numbered identically. As shown, a Boolean AND gate 360 receives the values on the output nodes 234 and 254. The Boolean AND gate 360 provides an exclusive-or (XOR) result on the output node 362. In a similar manner as the output nodes 234 and 254, the value on the output node 362 is received by one or more of a column multiplexer, other combinatorial logic and sequential elements. By using the Boolean AND gate 360, which receives values after the inverters 232 and 252, the capacitance loading on the bit lines 230 and 250 are reduced compared to using the Boolean NOR gate 260 described earlier.

When operands of the operation are not located in a same column, in an implementation, the column decoders assert selection lines for the column multiplexers in order to turn on at least two column multiplexers. Therefore, at least two bit lines are connected to a single output line connected to each of the multiple column multiplexers. In one example, a memory has 256 rows and 128 columns. In the example, the memory stores 1,024 words and each word is 32 bits. Therefore, the memory selects 32 output bits from the 128 columns, and includes 32 4:1 multiplexers.

For a two-operand operation, the stack of sequentially connected transistors are sized in a manner to be able to discharge two bit lines. Taking the stack of transistors 220 and 222 and bit line 230 as an example, if the column multiplexer receiving the bit line 230 is transparent (enabled), as is another column multiplexer for another column, then the stack of transistors 220 and 222 are sized appropriately to discharge bit line 230 and the other bit line in the other column. Therefore, the value on storage node 270 can be combined in a Boolean NOR operation with a value on a storage node in another column. In other implementations, stack of transistors 220 and 222 are sized appropriately to discharge only bit line 230, and the output value 234 generated by the inverter 232 and the output value of a similar inverter in the other column are combined by logic to produce a single result. In some implementations, the logic is dynamic logic and the output value 234 and the output value in the other column are inputs to the dynamic logic. For example, an NMOS transistor receives the output value 234 on its gate terminal for discharging the dynamic node on its drain terminal.

In one example, a first operand, opA, is located in a memory cell accessed by word line 0 (WL0) and column select 0 (CS0). In such an example, WL0 is word line input 280. A second operand, opB, is located in a memory cell accessed by WL0 and CS1. In order to obtain the result of the Boolean OR operation (opA OR opB), the word line WL0 is asserted and each of the column select lines CS0 and CS1 is asserted. In this example, each of opA and opB are in a same row, but they are located in different columns of the memory.

Figure 4:
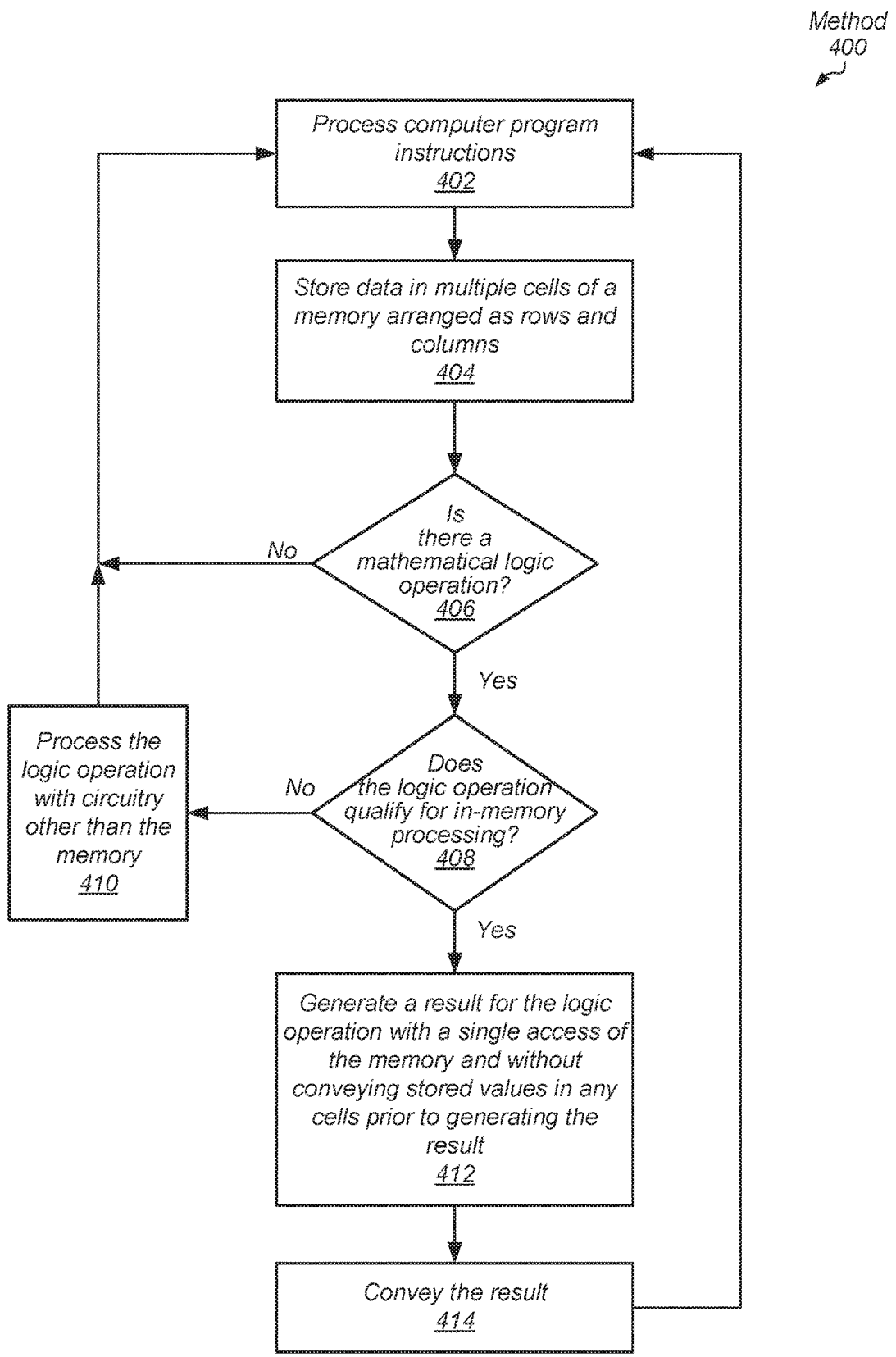
FIG. 4 is a flow diagram of one implementation of a method for performing operations in memory.

Referring now to FIG. 4, one implementation of a method 400 for performing operations in memory is shown. For purposes of discussion, the steps in this implementation (as well as in FIGS. 5 and 6) are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are capable of implementing method 400.

In block 402, program instructions are processed. In various implementations, the instructions are compiled, fetched from memory, decoded and executed. In some implementations, one or more instructions are pre-decoded. During the processing of instructions, data is stored in multiple cells of a memory arranged as rows and columns (block 404). In some implementations, the memory is a cache in a cache memory subsystem. In other implementations, the memory is a register file or other on-die storage of operand data.

After pre-decoding or decoding, if an operation is detected ("yes" branch of the conditional block 406), but the operation does not qualify for in-memory processing ("no" branch of the conditional block 408), then the operation is processed with circuitry other than the memory (block 410). For example, logic within an arithmetic logic unit (ALU) is used to process the operation. In some implementations, the operation is a Boolean logic operation. In various implementations, the memory is capable of processing particular Boolean logic operations by simultaneously accessing operands and providing the result. In an implementation, the memory is capable of processing a Boolean NOR operation, a Boolean NAND operation and one or more other results based on a combinatorial combining of the Boolean NOR operation and the Boolean NAND operation. For example, the memory is capable of generating a Boolean XOR result based on the results of the Boolean NOR operation and the Boolean NAND operation.

If the operation does qualify for in-memory processing ("yes" branch of the conditional block 408), then a result is generated for the logic operation with a single access of the memory and without conveying stored values in any cells prior to generating the result (block 412). For example, the operands are not stored in sequential elements at all when providing the result. Rather, in an implementation, two or more rows of the memory are simultaneously accessed, and a single bit line is evaluated based on the simultaneous access. Afterward, the result is conveyed (block 412). In an implementation, one or more column multiplexers select which columns convey results on the bit lines. The outputs of the column multiplexers are received by combinatorial logic, sequential elements, or both.

Figure 5:
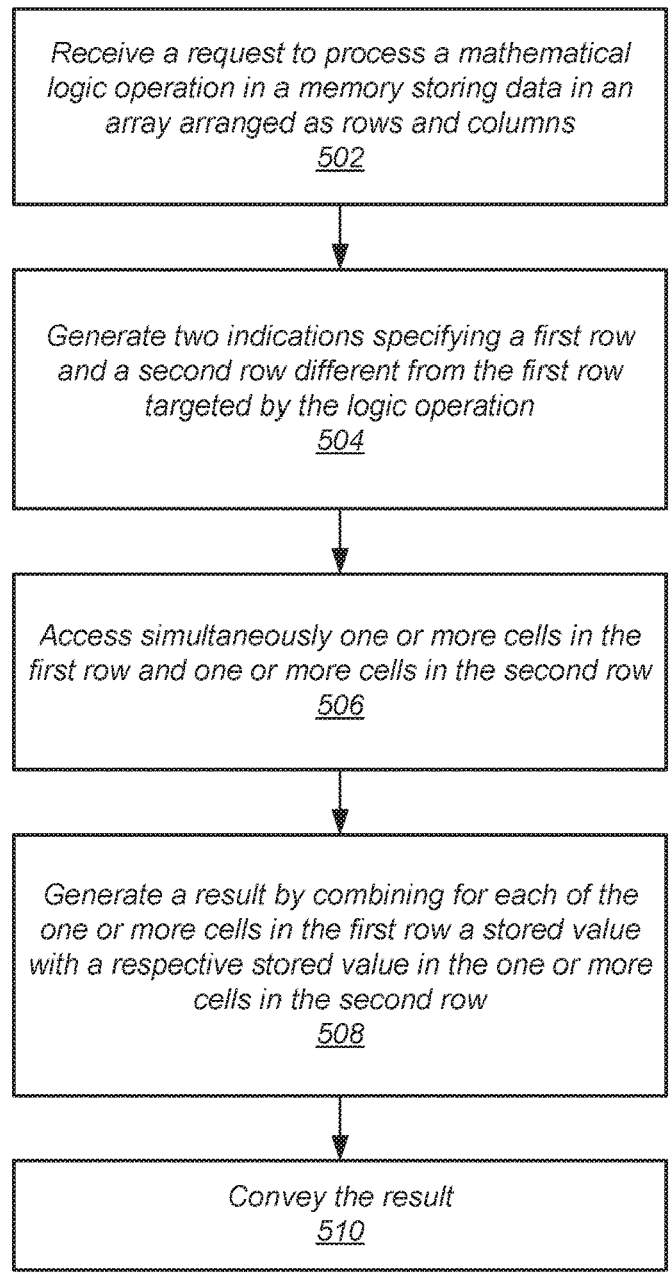
FIG. 5 is a flow diagram of another implementation of a method for performing operations in memory.

Referring now to FIG. 5, another implementation of a method 500 for performing operations in memory is shown. A request is received to process an operation in a memory storing data in an array arranged as rows and columns (block 502). Two indications are generated specifying a first row and a second row different from the first row targeted by the operation (block 504). For example, respective word lines are simultaneously asserted for the first row and the second row and one or more cells in the first row and one or more cells in the second row are simultaneously accessed (block 506). A result of the operation is then generated by combining (in a logical operation) a value stored in each of the one or more cells in the first row with a respective value stored in the one or more cells in the second row (block 508). In various implementations, a stack of sequentially connected transistors are used to discharge a precharged bit line corresponding to the operation. Either a value or its complement stored in the bit cell is used as one of the inputs of the stack of transistors. The result of the operation is then conveyed from the memory (block 510).

Figure 6:
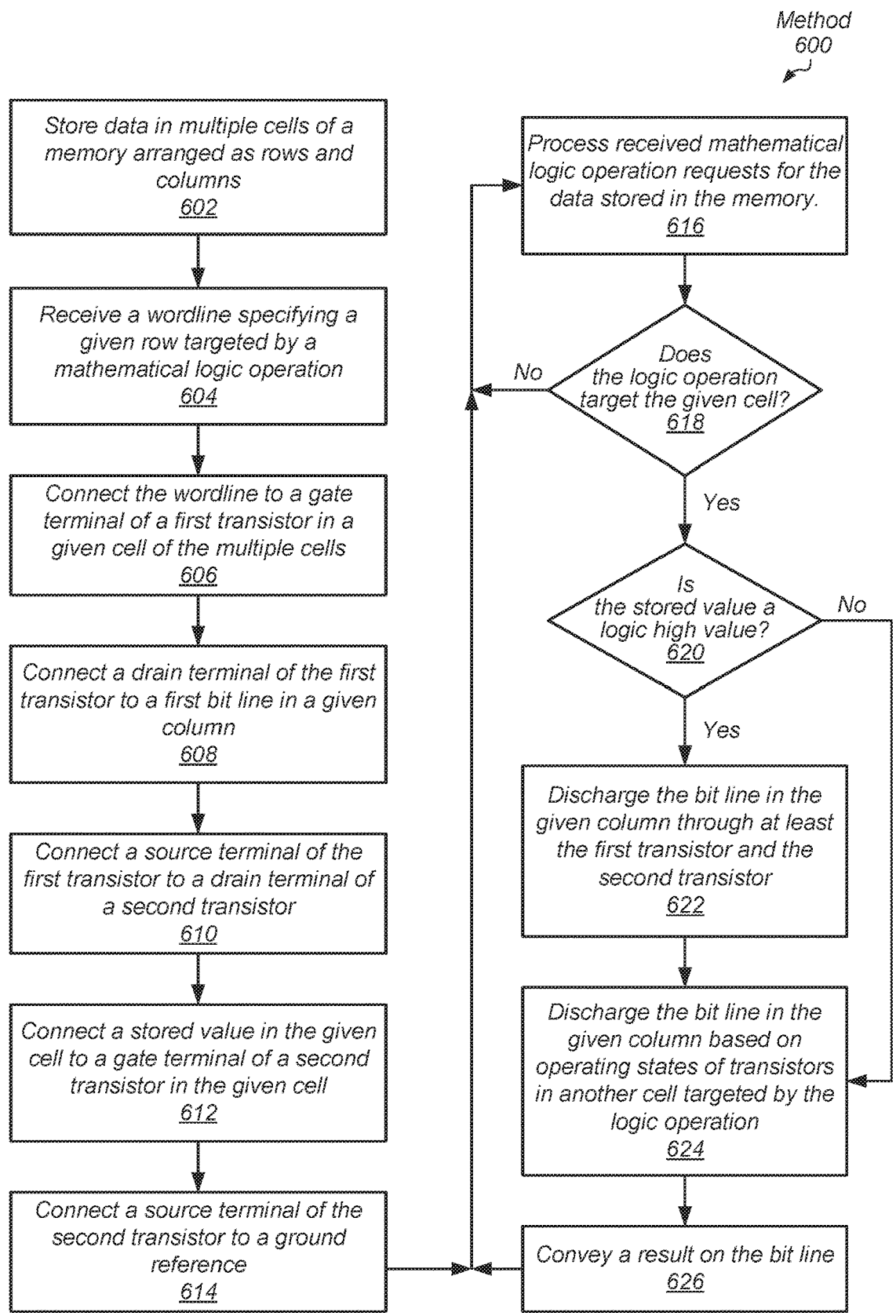
FIG. 6 is a flow diagram of another implementation of a method for performing operations in memory.

Referring now to FIG. 6, one implementation of a method 600 for performing operations in memory is shown. Data is stored in multiple cells of a memory arranged as rows and columns (block 602). A word line is received specifying a given row targeted by an operation (block 604). The word line is connected to a gate terminal of a first transistor in a given cell of the multiple cells (block 606). A drain terminal of the first transistor is connected to a first bit line in a given column (block 608). A source terminal of the first transistor is connected to a drain terminal of a second transistor (block 610). A stored value in the given cell is connected to a gate terminal of a second transistor in the given cell (block 612). A source terminal of the second transistor is connected to a ground reference (block 614). Received operation requests for the data stored in the memory are then processed (block 616).

If the operation targets the given cell ("yes" branch of the conditional block 618), and the stored value is a logic high value ("yes" branch of the conditional block 620), then the bit line in the given column is discharged through at least the first transistor and the second transistor (block 620). Additionally, the bit line in the given column is discharged based on operating states of transistors in another cell targeted by the operation (block 624). If the operation targets the given cell ("yes" branch of the conditional block 618), and the stored value is a logic low value ("no" branch of the conditional block 620), then the bit line in the given column is discharged based on operating states of transistors in another cell targeted by the operation (block 624). As such, the first transistor and the second transistor in the given cell are not used for discharging the bit line. The result on the bit line is then conveyed from the memory (block 626). As described earlier, the result on the bit line is received by one or more of combinatorial logic, a column multiplexer, and a sequential element. However, the operands of the operation are not read out or stored during the in-memory processing of the operation.

Figure 7:
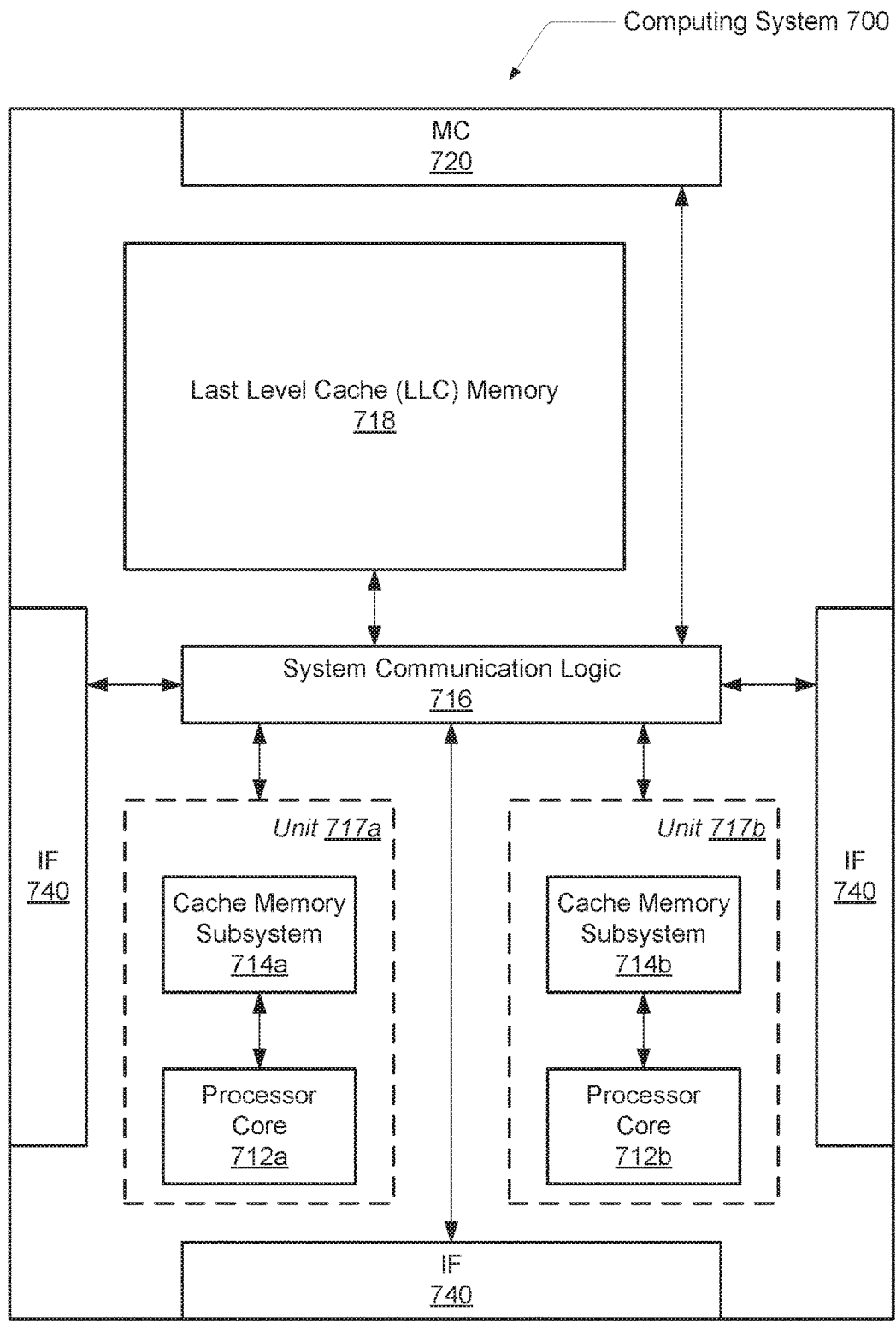
FIG. 7 is a block diagram of one implementation of a computing system.

Referring to FIG. 7, another implementation of a computing system 700 is shown. Generally speaking, the computing system 700 includes memory controller 720, interface logic 740, one or more processing units 715a-715b, which include processor cores 712a-712b and corresponding cache memory subsystems 714a-714b; system communication logic 716, and a shared cache memory subsystem 718. In an implementation, the shared cache 718 is a last-level cache. In one implementation, the illustrated functionality of the computing system 710 is incorporated upon a single integrated circuit. In another implementation, the illustrated functionality is incorporated in a chipset on a computer motherboard.

In one implementation, the computing system 710 is a stand-alone system within a mobile computer, a desktop, a server, or otherwise. In other implementations, the computing system 710 is one node within a socket of a multi-socket system. In some implementations, the processing units 715a-715b and one or more other sources outside of the computing system 710 access the shared cache memory subsystem 718. The other sources include general-purpose processors and graphical processing units (GPU's) on other nodes, input/output (I/O) devices, and so forth.

In other implementations, another level of cache, such as caches 714a-714b, in the cache memory hierarchy are shared by multiple sources. Although two processor cores are shown in FIG. 7, in other implementations, the computing system 700 includes another number of processor cores, such as a single processor core, four processor cores, and so forth. In various implementations, processor cores 712a-712b include circuitry for executing instructions according to a predefined instruction set architecture (ISA). In other implementations, the processor cores 712a-712b include other processors such as a graphics processing unit (GPU), another type of single-instruction-multiple-data (SIMD) core, a digital signal processor (DSP), a field programmable gate array (FPGA), and other computing circuitry.

Generally, processor cores 712a-712b access the cache memory subsystems 714a-714b, respectively, for data and instructions. The access regarding a cache memory subsystem refers to performing a read, a write, or an update request operation that results in a cache hit if the requested data of a corresponding request address resides in the cache or a cache miss if it does not reside in the cache. The data has corresponding metadata stored in the cache. In an implementation, the metadata includes a cache entry valid state, dirty and clean cache line states, home or local node and remote node states, cache coherence states, process or processor owner identifiers (ID's), thread ID's, system-level transaction ID's, shared and private states, instruction type and data type, and so forth. In various implementations, the size of a cache line to be accessed includes one or more of these fields in addition to the data.

If a cache miss occurs, such as a requested block is not found in a respective one of the cache memory subsystems 714a-714b or in shared cache memory subsystem 718, then a read request is generated and transmitted to the memory controller 720 to which the missing block is mapped. A corresponding cache fill line with the requested block is conveyed to the corresponding cache in order to complete the original request. In addition, the cache fill line is placed within a corresponding set within the cache. If there are no available ways within the corresponding set, then typically a Least Recently Used (LRU) algorithm determines which way within the set is to have its data evicted and replaced by the cache fill line data. As used herein, the term "allocate" refers to storing a cache fill line fetched from a lower level of the cache hierarchy into a way of a particular cache subsequent a cache miss to the particular cache.

In various implementations, cache subsystems 714a-714b and 718 include high-speed cache memories or arrays for storing blocks of data. In some implementations, variations of the six-transistor RAM bit cell are used. A corresponding cache controller is coupled to the cache arrays. In an implementation, cache memory subsystems 714a-714b are implemented as a hierarchy of caches. In some implementations, cache memory subsystems 714a-714b each represent L2 cache structures, and shared cache subsystem 718 represents an L3 cache structure. In an implementation, the L1 cache structure is integrated within each of the processor cores 712a-712b. Other combinations and hierarchies are possible and contemplated.

In various implementations, one or more of on-die register files, on-die caches, and cache memory subsystems 714a-714b process operations. For particular operations, the operands are accessed simultaneously for generating a result without being read out and stored. Memory controller 720 is used to connect the processor 700 to off-die memory. Memory controller 720 follows memory channel protocols for determining values used for information transfer, such as a number of data transfers per clock cycle, signal voltage levels, signal timings, signal and clock phases and clock frequencies. The off-die memory includes one of multiple types of dynamic random access memories (DRAMs) or other memory technologies.

The interface 740 includes integrated channel circuitry to directly link signals to other processing units or nodes. The interface 740 utilizes one or more coherence links for inter-node access of processor on-die caches and off-die memory of another processing node. Examples of the technology include HyperTransport and QuickPath. I/O devices include many variations of computer peripheral devices. In some implementations, system communication logic 716 is a system bus. In another implementation, processing node 710 incorporates a Northbridge system bus controller in logic 716 in order to couple processing units 715a-715b to an off-chip memory, input/output (I/O) devices, and other off-chip processors.

In various implementations, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors for executing program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A memory comprising:
an array of cells for storing data arranged as a plurality of rows and a plurality of columns;
a first interface configured to receive two or more indications identifying rows targeted by an operation;
a second interface configured to convey results of operations;
wherein in response to receipt of a request to perform a first Boolean logic operation on at least two operands and an indication that the at least two operands targeted by the first Boolean logic operation are in a first row, the array is configured to:
access, simultaneously, one or more cells in a first group in the first row to obtain a first operand of the at least two operands and one or more cells in a second group in the first row to obtain a second operand of the at least two operands; and
generate a first result of the first Boolean logic operation by performing the first Boolean logic operation on the obtained first operand and second operand.

2. The memory as recited in claim 1, wherein the array is configured to generate the first result of the first Boolean logic operation without conveying the values in each of the one or more cells in the first group or the values in each of the one or more cells in the second group to circuitry external to the array.

3. The memory as recited in claim 1, wherein in response to receiving indications specifying the first row and a second row different from the first row targeted by a second Boolean logic operation different from the first Boolean logic operation, the array is further configured to:
access, simultaneously, one or more cells in the first row and one or more cells in the second row;
generate a second result by performing the second Boolean logic operation using first values stored in the one or more cells in the first row and second values stored in the one or more cells in the second row; and
generate a third result simultaneously with the second result by performing a third Boolean logic operation different from the second Boolean logic operation using a complement of the first values and a complement of the second values.

4. The memory as recited in claim 1, wherein each cell comprises a first stack of serially connected transistors comprising:
   a first transistor configured to receive on its gate terminal one of the two or more indications; and
   a second transistor receiving on its gate terminal a stored value of a cell; and
   wherein a drain terminal of the first transistor is connected to a first bit line running along a column of the plurality of columns, wherein the first bit line provides a result during a dynamic evaluation stage.

5. The memory as recited in claim 4, wherein each cell comprises a second stack of serially connected transistors comprising:
   a third transistor configured to receive on its gate terminal one of two or more indications of two or more rows targeted by the third operation; and
   a fourth transistor configured to receive on its gate terminal a complement of a value stored in the cell.

6. The memory as recited in claim 5, wherein a drain terminal of the third transistor is connected to a second bit line different from the first bit line running along a column comprising the cell, wherein the second bit line provides the third result for the third operation during a dynamic evaluation stage.

7. The memory as recited in claim 6, further comprising circuitry configured to generate a fourth result by performing a fourth operation using the first result and the second result.

8. The memory as recited in claim 3, wherein during said performing the second Boolean logic operation, the first values are in a same column as the second values.

9. The memory as recited in claim 3, wherein the array is further configured to:
   generate the second result by performing the second Boolean logic operation using dynamic logic; and
   convey the second result via the second interface.

10. The memory as recited in claim 1, wherein the request identifies the Boolean logic operation.

11. A method, comprising:
    storing data in an array of cells arranged as a plurality of rows and a plurality of columns;
    receiving a request to perform a first Boolean logic operation on at least two operands;
    in response to receiving the request and an indication that the at least two operands targeted by the first Boolean logic operation are in a first row:
       accessing, simultaneously, one or more cells in a first group in the first row to obtain a first operand of the at least two operands and one or more cells in a second group in the first row to obtain a second operand of the at least two operands; and
       generating a first result of the first Boolean logic operation by performing the first Boolean logic operation on the obtained first operand and second operand.

12. The method as recited in claim 11, further comprising generating the first result without conveying the values in each of the one or more cells in the first group or the values in each of the one or more cells in the second group to circuitry external to the array.

13. The method as recited in claim 11, in response to receiving indications specifying the first row and a second row different from the first row targeted by a second Boolean logic operation different from the first Boolean logic operation, the method further comprises:
    accessing, simultaneously, one or more cells in the first row and one or more cells in the second row;
    generating a second result by performing the second Boolean logic operation using first values stored in the one or more cells in the first row and second values stored in the one or more cells in the second row; and
    generating a third result simultaneously with the first result by performing a third Boolean logic operation different from the second Boolean logic operation using a complement of the first values and a complement of the second values.

14. The method as recited in claim 11, wherein each cell comprises a first stack of serially connected transistors comprising:
    a first transistor receiving on its gate terminal one of the two or more indications; and
    a second transistor receiving on its gate terminal a stored value of a cell; and
    wherein a drain terminal of the first transistor is connected to a first bit line running along a column of the plurality of columns, wherein the first bit line provides a result during a dynamic evaluation stage.

15. The method as recited in claim 13, further comprising:
    generating the second result by performing the second Boolean logic operation using dynamic logic; and
    conveying the second result.

16. A computing system comprising:
    a memory configured to store data in an array of cells arranged as a plurality of rows and a plurality of columns;
    a processor configured to generate memory access requests and operation requests; and
    a memory controller;
    wherein in response to receiving a request to perform a first Boolean logic operation on at least two operands, the memory controller is configured to generate one or more indications specifying one or more rows targeted by the first Boolean logic operation; and
    wherein in response to receiving the request and an indication that the at least two operands targeted by the first Boolean logic operation are in a first row, the array is configured to:
       access, simultaneously, one or more cells in a first group in the first row to obtain a first operand of the at least two operands and one or more cells in a second group in the first row to obtain a second operand of the at least two operands; and
       generate a first result of the first Boolean logic operation by performing the first Boolean logic operation on the obtained first operand and second operand.

17. The computing system as recited in claim 16, wherein the memory is further configured to generate the first result of the first Boolean logic operation without conveying the values in each of the one or more cells in the first group or the values in each of the one or more cells in the second group to circuitry external to the array.

18. The computing system as recited in claim 16, wherein in response to receiving indications specifying the first row and a second row different from the first row targeted by a second operation different from the first Boolean logic operation, the memory is further configured to:
    access, simultaneously, one or more cells in the first row and one or more cells in the second row;
    generate a second result by performing the second Boolean logic operation using first values stored in the one or more cells in the first row and second values stored in the one or more cells in the second row; and generate a third result simultaneously with the first result by performing a third Boolean logic operation different from the second Boolean logic operation using a complement of the first values and a complement of the second values.

19. The computing system as recited in claim 18, wherein the memory is further configured to:

generate the second result by performing the second Boolean logic operation using dynamic logic; and convey the fourth result via the second interface.

20. The computing system as recited in claim 18, wherein during said performing the first Boolean logic operation, each stored value in the first group is in a different column than the respective stored value in the second group, and wherein the two or more indications comprises a word line for identifying a third row and column selects for identifying columns for the first Boolean logic operation.

* * * * *